US010864551B2

(12) United States Patent
Sudol (10) Patent No.: US 10,864,551 B2
(45) Date of Patent: Dec. 15, 2020

(54) COMPACT ULTRASOUND TRANSDUCER WITH DIRECT COAX ATTACHMENT

(71) Applicant: KONINKLIJKE PHILIPS N.V., Eindhoven (NL)

(72) Inventor: Wojtek Sudol, Eindhoven (NL)

(73) Assignee: Koninklijke Philips, N.V., Eindhoven (NL)

( * ) Notice: Subject to any disclaimer, the term of this patent is extended or adjusted under 35 U.S.C. 154(b) by 279 days.

(21) Appl. No.: 15/528,877

(22) PCT Filed: Dec. 14, 2015

(86) PCT No.: PCT/IB2015/059570
§ 371 (c)(1),
(2) Date: May 23, 2017

(87) PCT Pub. No.: WO2016/097959
PCT Pub. Date: Jun. 23, 2016

(65) Prior Publication Data
US 2017/0326589 A1      Nov. 16, 2017

Related U.S. Application Data

(60) Provisional application No. 62/091,795, filed on Dec. 15, 2014.

(51) Int. Cl.
*B06B 1/02* (2006.01)
*G01N 29/24* (2006.01)
*H01R 43/02* (2006.01)
*H01R 4/02* (2006.01)
*H03H 3/007* (2006.01)

(52) U.S. Cl.
CPC ....... *B06B 1/0292* (2013.01); *G01N 29/2406* (2013.01); *H01R 4/023* (2013.01); *H01R 43/0207* (2013.01); *H03H 3/0072* (2013.01); *G01N 2291/106* (2013.01)

(58) Field of Classification Search
CPC .. H01R 4/023; H01R 43/0207; H03H 3/0072; G01N 2291/106
USPC ........................................................ 310/300
See application file for complete search history.

(56) References Cited

U.S. PATENT DOCUMENTS

| | | |
|---|---|---|
| 3,980,986 A | 9/1976 | Baird et al. |
| 5,854,450 A | 12/1998 | Kent |
| 5,933,163 A | 8/1999 | Koizumi et al. |
| 6,497,667 B1 | 12/2002 | Miller et al. |
| 2004/0141421 A1 | 7/2004 | Cheng et al. |
| 2010/0278015 A1* | 11/2010 | Huang .................. B06B 1/0292 367/181 |
| 2011/0213592 A1 | 9/2011 | Adachi et al. |

(Continued)

FOREIGN PATENT DOCUMENTS

| | | |
|---|---|---|
| CN | 1110945 A | 11/1995 |
| CN | 1179845 A | 4/1998 |

(Continued)

*Primary Examiner* — Forrest M Phillips (57) ABSTRACT

An ultrasound device includes a transducer array (404) formed on a first side of a substrate (402). A through via (406) passes through a thickness of the substrate between the first side and a second side, opposite the first side. A conductor (410) is electrically coupled to the through via on the second side to provide signals to and from the transducer array.

17 Claims, 5 Drawing Sheets

(56) References Cited

U.S. PATENT DOCUMENTS

| | | | |
|---|---|---|---|
| 2013/0267853 A1* | 10/2013 | Dausch | B06B 1/0607 |
| | | | 600/466 |
| 2015/0162887 A1* | 6/2015 | Jurzitza | G01R 19/10 |
| | | | 156/580.1 |
| 2015/0366508 A1 | 12/2015 | Chou et al. | |
| 2016/0006372 A1* | 1/2016 | Elata | B81B 3/0072 |
| | | | 310/300 |
| 2016/0031701 A1* | 2/2016 | Schmid | B81C 1/00142 |
| | | | 310/300 |
| 2016/0199030 A1* | 7/2016 | Patil | B06B 1/02 |
| | | | 600/459 |

FOREIGN PATENT DOCUMENTS

| | | |
|---|---|---|
| EP | 0670222 A2 | 9/1995 |
| JP | 2008520316 A | 6/2008 |
| JP | 2011078755 A | 4/2011 |
| WO | 2006054260 A1 | 5/2006 |

\* cited by examiner

COMPACT ULTRASOUND TRANSDUCER WITH DIRECT COAX ATTACHMENT

This application is the U.S. National Phase application under 35 U.S.C. § 371 of International Application No. PCT/IB2015/059570, filed on Dec. 14, 2015, which claims the benefit of U.S. Provisional Application Ser. No. 62/091,795 filed Dec. 15, 2014. These applications are hereby incorporated by reference herein.

BACKGROUND

Technical Field

This disclosure relates to ultrasound transducers and more particularly to transducers and methods for making the same having simplified electrical interconnections between a coaxial cable and a transducer array.

Description of the Related Art

In transducer assemblies currently being manufactured, a printed circuit board (PCB) is connected to an ultrasound transducer array using a flex termination. The PCB functions as a termination for the signal carrying coaxial cable which is connected to the PCB by solder. The flex termination is also connected to the PCB on a same side as the coaxial cable and is also soldered. The PCB bridges the electrical connection between the coaxial cable and transducer elements of the transducer array, which are mounted on a separate substrate and connected to the other end of the flex termination. In some assemblies, there may be more than one PCB or other intermediate substrates used for the interconnection between the coaxial cable and the ultrasound transducer array.

A typical assembly method includes the coaxial cable interconnection to the PCB. Then, the flex termination connection is made to the array. Next, connection between the assemblies is made by soldering the flex termination to the PCB. The flex termination is employed to provide a bend to enable orientation of the transducer array to be perpendicular to the coaxial cable direction to form a forward looking transducer array design or to move the transducer array parallel and off-axis of the coaxial cable to permit a side-looking transducer array design.

The multi-tiered interconnection, as described, while adequate suffers from a number of consequences. These consequences include fabrication complexity, inefficient use of space and product cost. These consequences are especially disadvantageous in catheter designs that would benefit from minimizing the space required to fit a transducer array and would further benefit from reduced cost for disposable products.

SUMMARY

In accordance with the present principles, an ultrasound device includes a transducer array formed on a first side of a substrate. At least one through via passes through a thickness of the substrate between the first side and a second side, opposite the first side. A conductor is electrically coupled to the at least one through via on the second side to provide signals to and from the transducer array.

Another ultrasound device includes a transducer array formed on a first side of a silicon substrate. A plurality of through silicon vias passes through a thickness of the substrate between the first side and a second side, opposite the first side. Conductive bumps are connected to the plurality of through silicon vias on the second side. The conductive bumps include solder caps. A coaxial cable includes a center conductor and a ground shield. The center conductor and the ground shield are electrically connected to the solder caps. The coaxial cable provides signals to and from the transducer array.

A method for fabricating an ultrasound device includes providing a transducer array on a first side of a substrate, the substrate including at least one through via passing through a thickness of the substrate between the first side and a second side, opposite the first side; electrically coupling a conductor to the at least one through via on the second side, the conductor providing signals to and from the transducer array; and encasing the transducer array and conductor in an ultrasound window.

These and other objects, features and advantages of the present disclosure will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF EMBODIMENTS

In accordance with the present principles, an ultrasound transducer, transducer assembly and methods for manufacture are provided. The present principles provide the transducer array on a substrate where through vias and in particular through silicon vias (TSVs) can be employed. The vias are formed through the substrate on which the transducer elements are formed or mounted. The through via can then be connected to by the coaxial cable. In this way, an easier-to-manufacture design is provided that has a more compact size with more efficient use of space, and, as a consequence, costs are significantly reduced.

In one embodiment, capacitive micromachined ultrasonic transducers (CMUTs) are employed. A CMUT substrate provides a smaller profile and is useful for a compact design. In addition, the CMUT substrate permits the formation of a through via to connect the coaxial cable to the transducer elements. In another embodiment, a one dimensional array of transducer elements may be provided on a silicon interposer substrate. The interposer substrate permits the formation of a through via to connect the coaxial cable to the transducer elements. In yet another embodiment, a two dimensional array (xMatrix) of transducer elements may be provided on an application-specific integrated circuit (ASIC) chip. The ASIC permits the formation of a through via to connect the coaxial cable to the transducer elements. In addition, a de-coupling capacitor element can be added on a same side of the ASIC as the coaxial cable connections. This provides the capacitor in close proximity to the microbeam forming circuit on or near the ASIC. These designs are illustrative and are particularly useful for side-looking transducers; however, other designs and configurations are also contemplated. By employing through vias, flex terminations, intermediate components and other bridge devices employed in the prior art are eliminated.

It should be understood that the present principles will be described in terms of ultrasonic transducers; however, the teachings of the present invention are much broader and are applicable to any transducer elements. In some embodiments, the present principles are employed in tracking or analyzing complex biological or mechanical systems. In particular, the present principles are applicable to imaging technologies that may be employed in imaging biological systems, in all areas of the body, such as soft tissues, organs, etc. The present principles are not however limited to biological imaging and may be applicable in imaging of mechanical or structural systems as well, for example, pipes, mechanical systems, fluid flow, etc. The elements depicted in the FIGS. may be implemented in various combinations of hardware and software and provide functions which may be combined in a single element or multiple elements.

The functions of the various elements shown in the FIGS. can be provided through the use of dedicated hardware as well as hardware capable of executing software in association with appropriate software. When provided by a processor, the functions can be provided by a single dedicated processor, by a single shared processor, or by a plurality of individual processors, some of which can be shared. Moreover, explicit use of the term "processor" or "controller" should not be construed to refer exclusively to hardware capable of executing software, and can implicitly include, without limitation, digital signal processor ("DSP") hardware, read-only memory ("ROM") for storing software, random access memory ("RAM"), non-volatile storage, etc.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Thus, for example, it will be appreciated by those skilled in the art that the block diagrams presented herein represent conceptual views of illustrative system components and/or circuitry embodying the principles of the invention. Similarly, it will be appreciated that any flow charts, flow diagrams and the like represent various processes which may be substantially represented in computer readable storage media and so executed by a computer or processor, whether or not such computer or processor is explicitly shown.

Furthermore, embodiments of the present invention can take the form of a computer program product accessible from a computer-usable or computer-readable storage medium providing program code for use by or in connection with a computer or any instruction execution system. For the purposes of this description, a computer-usable or computer readable storage medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), Blu-Ray™ and DVD.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
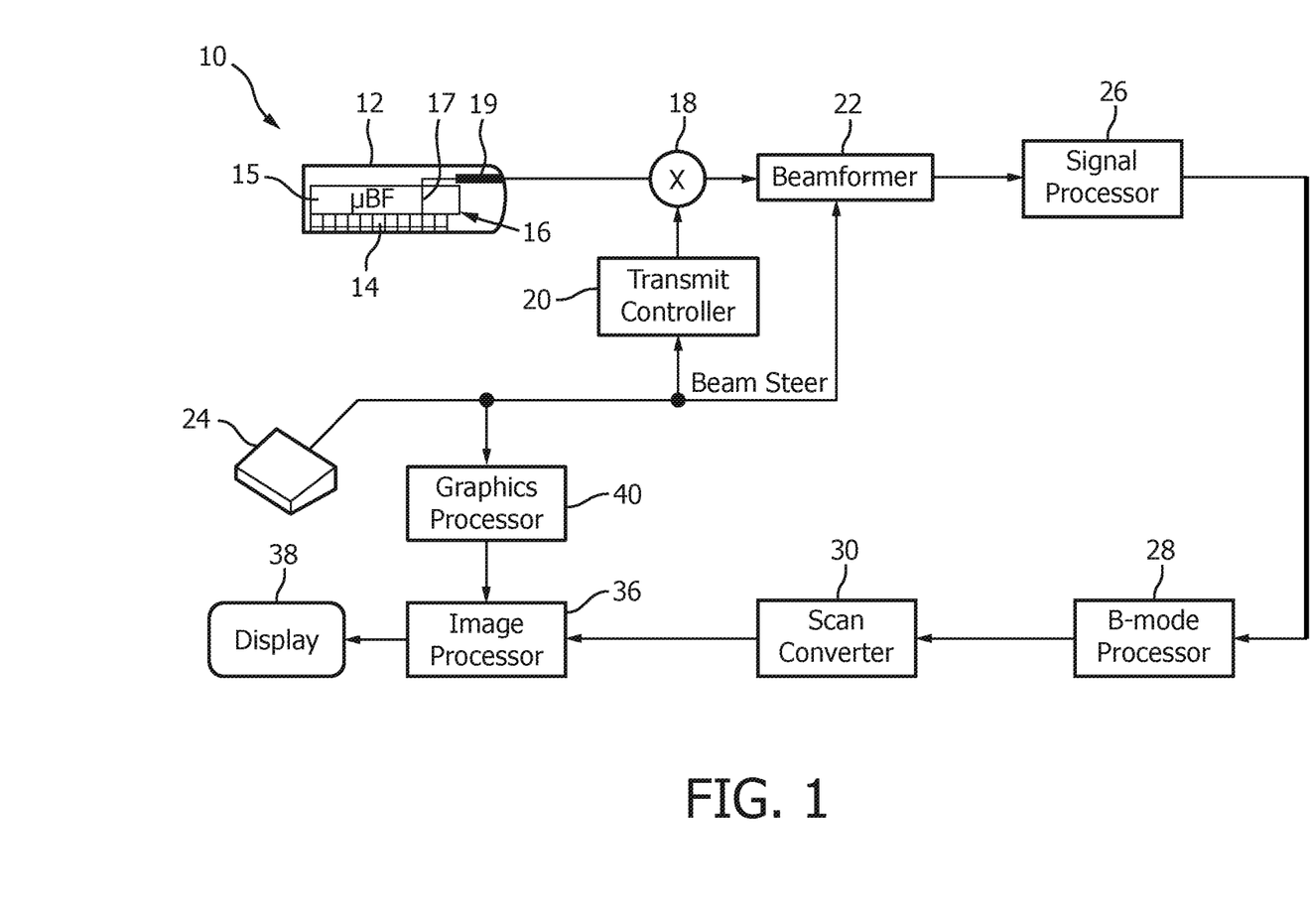
FIG. 1 is a block/flow diagram showing an ultrasonic system having a compact ultrasound transducer in accordance with one embodiment.

Referring now to the drawings in which like numerals represent the same or similar elements and initially to FIG. 1, an ultrasound imaging system 10 constructed in accordance with the present principles is shown in block diagram form. The ultrasound system 10 includes a transducer device or probe 12 having a transducer array 14 for transmitting ultrasonic waves and receiving echo information. The transducer array 14 may be configured as, e.g., linear arrays, two dimensional arrays, phased arrays, etc., and can include piezoelectric elements or capacitive micromachined ultrasonic transducers (CMUT) elements. The transducer array 14, for example, can include a two dimensional array of transducer elements capable of scanning in both elevation and azimuth dimensions for 2D and/or 3D imaging. Electrical signals are carried to the transducer array 14 using, e.g., a coaxial cable 19. The coaxial cable 19 includes a center conductor and a ground shield in a concentric or coaxial configuration. The ground shield assists in reducing cross talk between adjacent conductors.

The transducer array 14 is coupled to a microbeamforming circuit or microbeamformer 16 in the probe 12, which controls transmission and reception of signals by the transducer elements in the array. The microbeamformer 16 may be included on or in a substrate 15, e.g., in an application specific integrated circuit (ASIC) or may be included on a separate chip or device (e.g., silicon interposer for 1D arrays or a CMUT substrate). In accordance with the present principles, the transducer array 14 is formed on the substrate 15 (e.g., ASIC, silicon interposer, CMUT substrate, etc.), and the substrate 15 includes at least one through via 17. The through via 17 connects the coaxial cable 19 to the transducer array 14 on an opposite side of the substrate 15.

In this example, the microbeamformer 16 is coupled to a transmit/receive (T/R) switch 18, which switches between transmission and reception and protects a main beamformer 22 from high energy transmit signals. In some embodiments, the T/R switch 18 and other elements in the system can be included in the transducer probe rather than in a separate ultrasound system base. The transmission of ultrasonic beams from the transducer array 14 under control of the microbeamformer 16 is directed by a transmit controller 20 coupled to the T/R switch 18 and the beamformer 22, which may receive input from the user's operation of a user interface or control panel 24.

One function controlled by the transmit controller 20 is the direction in which beams are steered. Beams may be steered straight ahead from (orthogonal to) the transducer array 14, or at different angles for a wider field of view. The partially beamformed signals produced by the microbeamformer 16 are coupled to a main beamformer 22 where partially beamformed signals from individual patches of transducer elements are combined into a fully beamformed signal.

The beamformed signals are coupled to a signal processor 26. The signal processor 26 can process the received echo signals in various ways, such as bandpass filtering, decimation, I and Q component separation, and harmonic signal separation. The signal processor 26 may also perform additional signal enhancement such as speckle reduction, signal compounding, and noise elimination. The processed signals are coupled to a B mode processor 28, which can employ amplitude detection for the imaging of structures in the body. The signals produced by the B mode processor are coupled to a scan converter 30. The scan converter 30 arranges the echo signals in the spatial relationship from which they were received in a desired image format. For instance, the scan converter 30 may arrange the echo signal into a two dimensional (2D) sector-shaped format, or a pyramidal three dimensional (3D) image. The 2D or 3D images are coupled from the scan converter 30 to an image processor 36 for further enhancement, buffering and temporary storage for display on an image display 38. A graphics processor 40 can generate graphic overlays for display with the ultrasound images. These graphic overlays or parameter blocks can contain, e.g., standard identifying information such as patient name, date and time of the image, imaging parameters, frame indices and the like. For these purposes, the graphics processor 40 receives input from the user interface 24, such as a typed patient name. The user interface 24 can also be employed for selection and control of a display of images.

Figure 2:
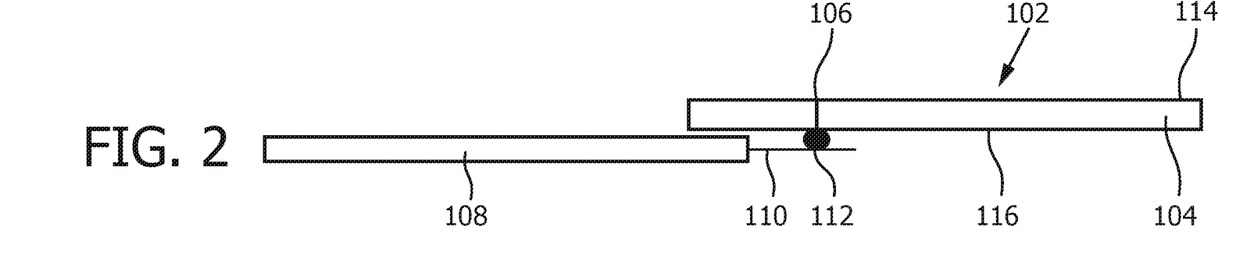
FIG. 2 is a cross-sectional view showing an ultrasound device having a conductor connected to a substrate opposite a capacitive micromachined ultrasound transducer array by employing a through via in accordance with one embodiment.

Referring to FIG. 2, a cross-sectional view is shown for an electrical connection scheme in accordance with one embodiment. In this embodiment, a transducer array 102 is formed on a substrate 104 and is configured as capacitive micromachined ultrasonic transducer (CMUT) elements, which are integrated therein. The substrate 104 preferably includes a crystalline semiconductor material such as Si, SiGe, GaAs or the like. In particularly useful embodiments, the substrate 104 includes monocrystalline silicon. The transducer elements are formed on a first side 114 of the substrate 104. The transducer elements are electrically connected to a through via 106. The through via 106 is formed through the entire thickness of the substrate 104 and permits an electrical connection from the first side 114 to a second side 116 of the substrate 104.

Components (e.g., transducer elements) on the first side 114 are connected to a first end of the through via 106. An electrical cable 108, such as a coaxial cable, is connected to a second end of the through via 106. It should be understood that one cable 108 is depicted for simplicity; however, a plurality of cables 108 may be aligned adjacent to one another and connected to a same substrate having multiple through vias 106.

In one embodiment, the through via 106 includes a solder ball 112 connected on its second end. A conductor 110 such as a center conductor for a coaxial cable connects to the solder ball 112 and therefore the second end of the through via 106. The through via 106 may include a through silicon via (TSV), and the solder ball 112 may include a coaxial solder termination to a back side (second side 116) of the substrate 104. In accordance with the embodiment of FIG. 2, the cable 108 is directly terminated to the back side 116 of the substrate 104 on which the transducer array 102 is formed. This is especially suitable for CMUT disposable catheter devices. This technique can also be employed in 1D arrays where a silicon interposer is employed as shown in FIG. 3.

Figure 3:
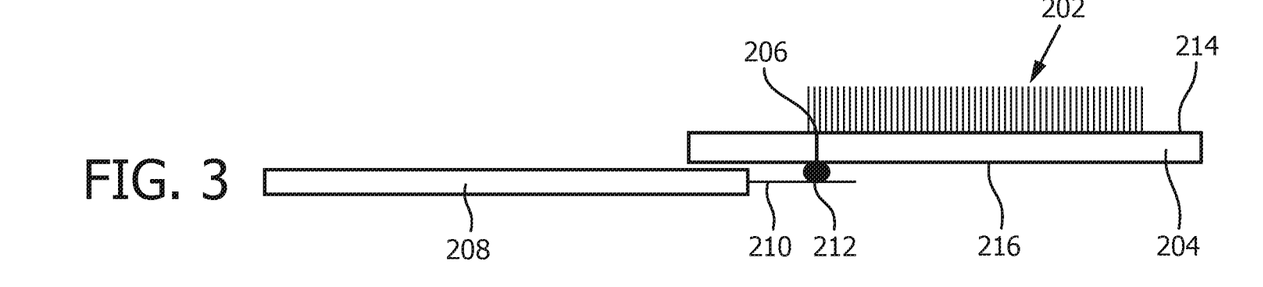
FIG. 3 is a cross-sectional view showing an ultrasound device having a conductor connected to an interposer substrate opposite a one-dimensional ultrasound transducer array by employing a through via in accordance with one embodiment.

Referring to FIG. 3, a cross-sectional view is shown for an electrical connection scheme in accordance with another embodiment. In this embodiment, a transducer array 202 is formed on or in a substrate 204. Substrate 204 may be an interposer substrate preferably including a crystalline semiconductor material such as Si, SiGe, GaAs or the like. In particularly useful embodiments, the substrate 204 includes monocrystalline silicon. The transducer elements are formed on a first side 214 of the substrate 204. The transducer elements are electrically connected to a through via 206. The through via 206 is formed through the entire thickness of the substrate 204 and permits an electrical connection from the first side 214 to a second side 216 of the substrate 204. The substrate 204 may include electrical lines or conductors for connecting to other components or devices (e.g., integrated circuits) on either side of the substrate 204.

Components (e.g., transducer elements) on the first side 214 are connected to a first end of the through via 206. An electrical cable 208, such as a coaxial cable, is connected to a second end of the through via 206. It should be understood that one cable 208 is depicted for simplicity; however, a plurality of cables 208 may be aligned adjacent to one another and connected to a same substrate having multiple through vias 206.

The transducer array 202 includes a 1D array of elements on a first side 214 of the substrate 204. In one embodiment, the through via 206 includes a solder ball 212 connected on its second end. A conductor 210, such as a center conductor for a coaxial cable, connects to the solder ball 212 and therefore the second end of the through via 206. The through via 206 may include a through silicon via (TSV), and the solder ball 212 may include a coaxial solder termination to a back side (second side 216) of the substrate 204. In accordance with the embodiment of FIG. 3, the cable 208 is directly terminated to the back side 216 of the substrate 204 on which the transducer array 202 is formed.

A plurality of 1D arrays may be employed to form a larger array. The larger array may include a connection scheme or pattern for a number of coaxial cables that may be implemented focusing on efficient packaging and reduced size and cost.

Figure 4:
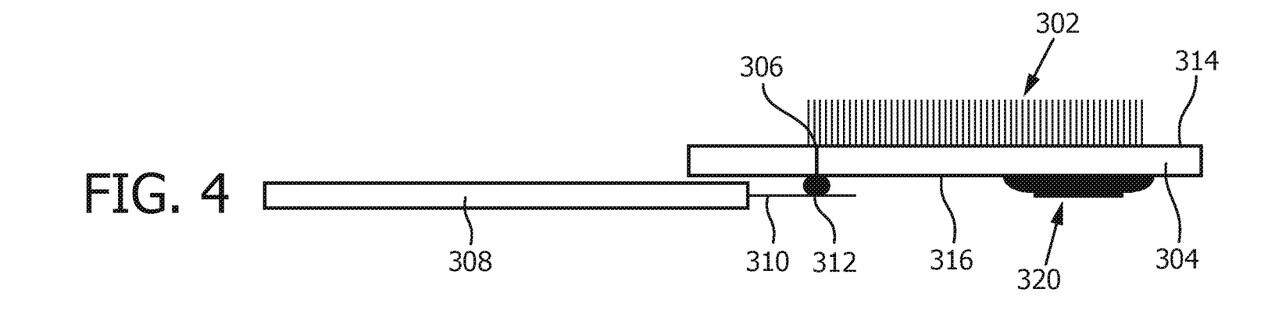
FIG. 4 is a cross-sectional view showing an ultrasound device having a conductor connected to an application specific integrated circuit opposite a matrix ultrasound transducer array by employing a through via in accordance with one embodiment.

Referring to FIG. 4, a cross-sectional view is shown for an electrical connection scheme in accordance with another embodiment. In this embodiment, a transducer array 302 is formed on or in a substrate 304. The transducer array 302 includes a two dimensional array or xMatrix. Substrate 304 preferably includes a crystalline semiconductor material such as Si, SiGe, GaAs or the like. Substrate 304 may include an application specific integrated circuit (ASIC) or other integrated circuit (IC). In one embodiment, the ASIC or other IC may include microbeam forming circuitry.

In particularly useful embodiments, the substrate 304 includes monocrystalline silicon. The transducer elements or array 302 are formed on a first side 314 of the substrate 304. The transducer elements are electrically connected to a through via or vias 306. The through via 306 is formed through the entire thickness of the substrate 304 and permits an electrical connection from the first side 314 to a second side 316 of the substrate 304.

Components (e.g., transducer elements) on the first side 314 are connected to a first end of the through via 306. An electrical cable 308, such as a coaxial cable, is connected to a second end of the through via 306. It should be understood that one cable 308 is depicted for simplicity; however, a plurality of cables 308 may be aligned adjacent to one another and connected to a same substrate having multiple through vias 306. A plurality of connection schemes may be implemented focusing on efficient packaging and reduced size and cost.

The transducer array 302 includes a 2D array of elements on a first side 314 of the substrate 304. In one embodiment, the through via 306 includes a solder ball 312 connected on its second end. A conductor 310, such as a center conductor for a coaxial cable, connects to the solder ball 312 and therefore the second end of the through via 306. The through via 306 may include a through silicon via (TSV), and the solder ball 312 may include a coaxial solder termination to a back side (second side 316) of the substrate 304. In accordance with the embodiment of FIG. 4, the cable 308 is directly terminated to the back side 316 of the substrate 304 on which the transducer array 302 is formed.

A de-coupling capacitor(s) 320 is/are soldered or otherwise connected to the second side 316 of the substrate 304 in close proximity to microbeam forming circuitry formed on the substrate 304 or connected through the cable 308. The capacitors 320 can be soldered with similar technology to the back of the substrate 304 at the same time (or different time) as the cable soldering.

It should be understood that in some embodiments, that the solder ball or bump 112, 212, 312 is connected to the through via 106, 206, 306, respectively, using a metal pad (not shown). The through vias are finished with the metal pad (bump) on the back side of the substrate. The metal pad (bump) may be fabricated with a "solder cap" (e.g., a solder ball or bump) thereon. While one solution may include solder pre-applied on the tips of copper bumps, other ways of conductive connection application can be implemented including but not limited to solder ball printing, conductive polymer printing (with aerosol jet technology or with precision dispensing) or other interconnect technologies.

Referring to FIGS. 5A-5E, processing steps for connecting a coaxial cable to a transducer substrate are shown in accordance with one illustrative embodiment. FIGS. 5A-5E show a substrate 402 that may include any of the embodiments described with respect to FIGS. 2-4. A transducer array 404 formed on a side opposite from a connection to a coaxial cable 408. The transducer array 404 may include a 1D array, a 2D array, CMUTs, etc.

Figure 5A:
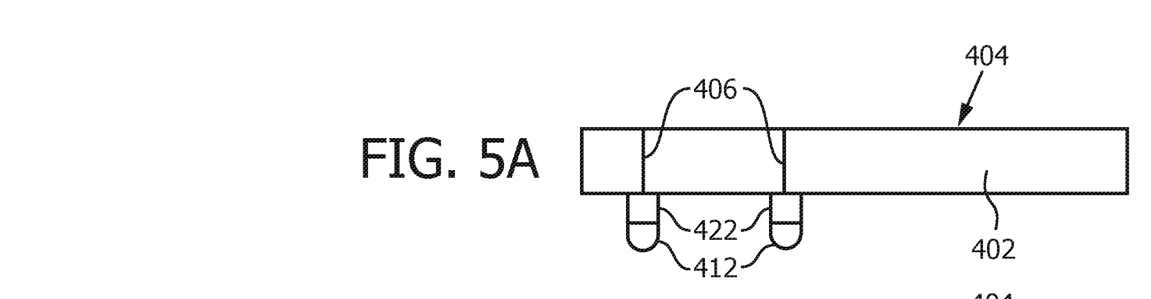
FIG. 5A is a cross-sectional view showing a substrate having through vias terminated with conductive bumps and solder caps for multiple through vias in accordance with one embodiment.

Referring to FIG. 5A, the substrate 402 includes through vias 406. The through vias 406 are spaced apart to permit connections to both a center conductor and a shield of a coaxial cable. The through vias 406 are terminated using a bump or post 422. The bumps 422 may be placed on a conductive pad connected to the through via 406. The bumps 422 and pads preferably include a highly conductive metal material, such as copper, gold, etc. Solder caps or balls 412 are formed on the bumps 422.

Figure 5B:
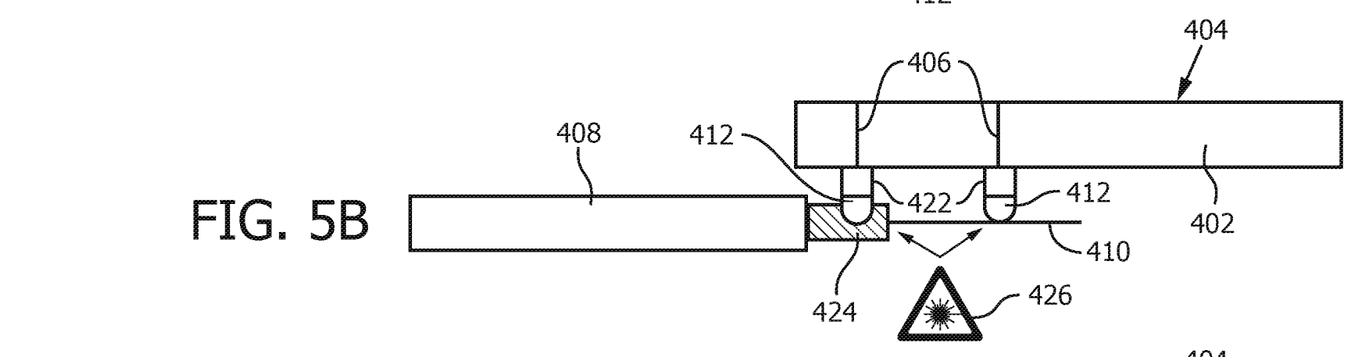
FIG. 5B is a cross-sectional view showing a coaxial cable moved in proximity to the through vias terminated with conductive bumps and solder caps for laser soldering in accordance with one embodiment.

Referring to FIG. 5B, a prepared coaxial cable 408 (e.g., stripped by laser technology) is positioned such that a center conductor 410 and ground or shield 424 are brought into close contact with areas corresponding to solder caps 412 on the back of the substrate 402. One through via 406 corresponds with a position of the shield 424, and one through via 406 corresponds with the position of the center conductor 410. Reflow technology using a laser 426 or other method may be employed to melt the solder of solder caps 412 in an inert atmosphere to make the connections.

Figure 5C:
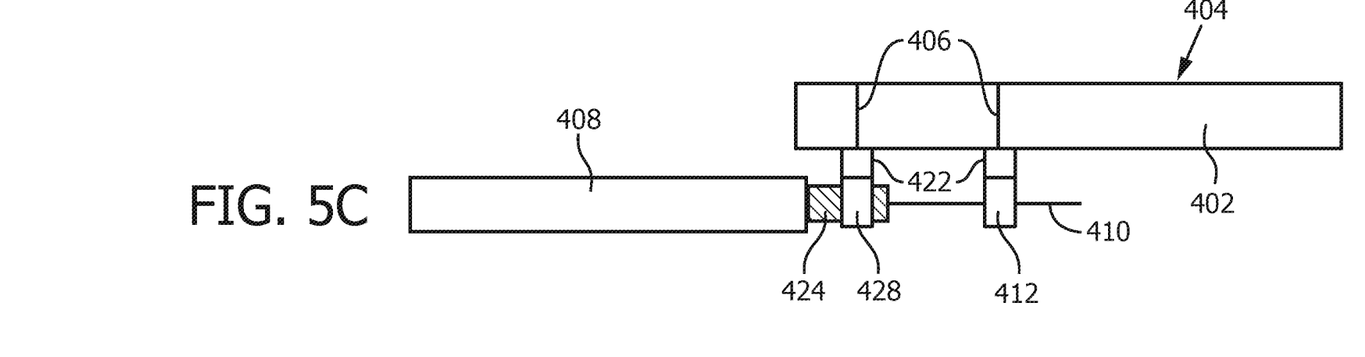
FIG. 5C is a cross-sectional view showing the coaxial cable soldered to the through vias in the substrate in accordance with one embodiment.

Referring to FIG. 5C, a soldered coaxial cable 408 is shown connected to the through vias 406. The center conductor 410 and ground or shield 424 are joined to the bumps 422 by reflowed solder regions (electrical connections) 428 on the back of the substrate 402. Note that other components, such as capacitors, thermistors and the like may also be soldered or otherwise connected to the back of the substrate 402.

Figure 5D:
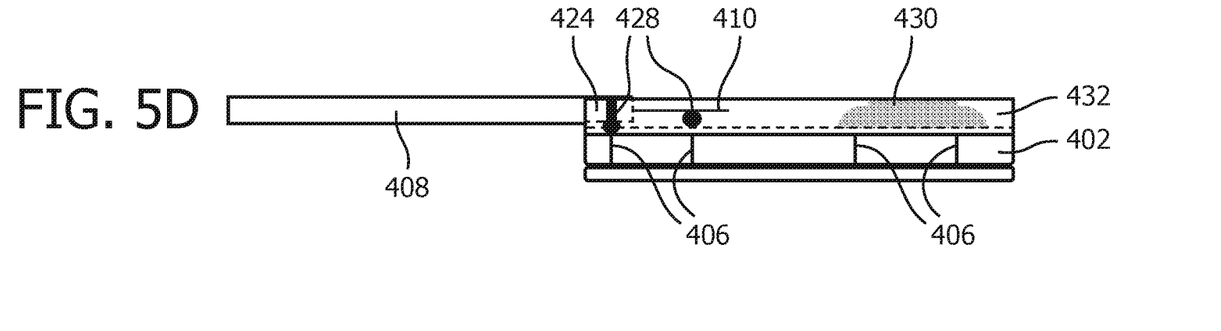
FIG. 5D is a cross-sectional view showing the coaxial cable and capacitor component overcoated in accordance with one embodiment.

Referring to FIG. 5D, a backing overcoat process is performed to encapsulate the coaxial cable 408 and to protect the electrical connections 428. Overcoating material 432 includes a dielectric material and may include an epoxy or urethane. In this embodiment a capacitor 430 is illustratively depicted. The capacitor 430 is also encapsulated in the overcoating material 432.

Figure 5E:
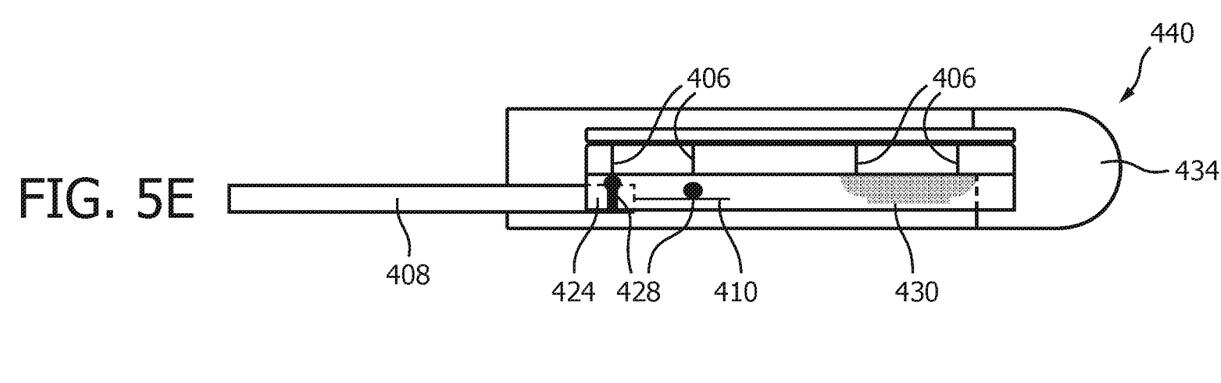
FIG. 5E is a cross-sectional view showing a transducer array, capacitor and coaxial cable encased in an ultrasound window in accordance with one embodiment.

Referring to FIG. 5E, a window (enclosure) 434 is placed over the overcoated substrate 402 to form a side-looking ultrasound probe 440. An adhesive is employed to seal and secure the window 434 in place. The window 434 may be injection molded from a plastic material such as Pebax™ or the like. The probe 440 may be employed in an ultrasound probe or in a catheter (e.g., Intracardiac Echocardiography (ICE)). The catheter may be disposable or reusable.

In accordance with the present principles, a thickness of the probe 440 is significantly reduced over prior art devices. In particularly useful embodiments, a thickness of the probe 440 is reduced to about a thickness of the substrate 402, the coaxial cable diameter (408) and the thickness of the window 434 (on both sides of the probe 440).

Figure 6:
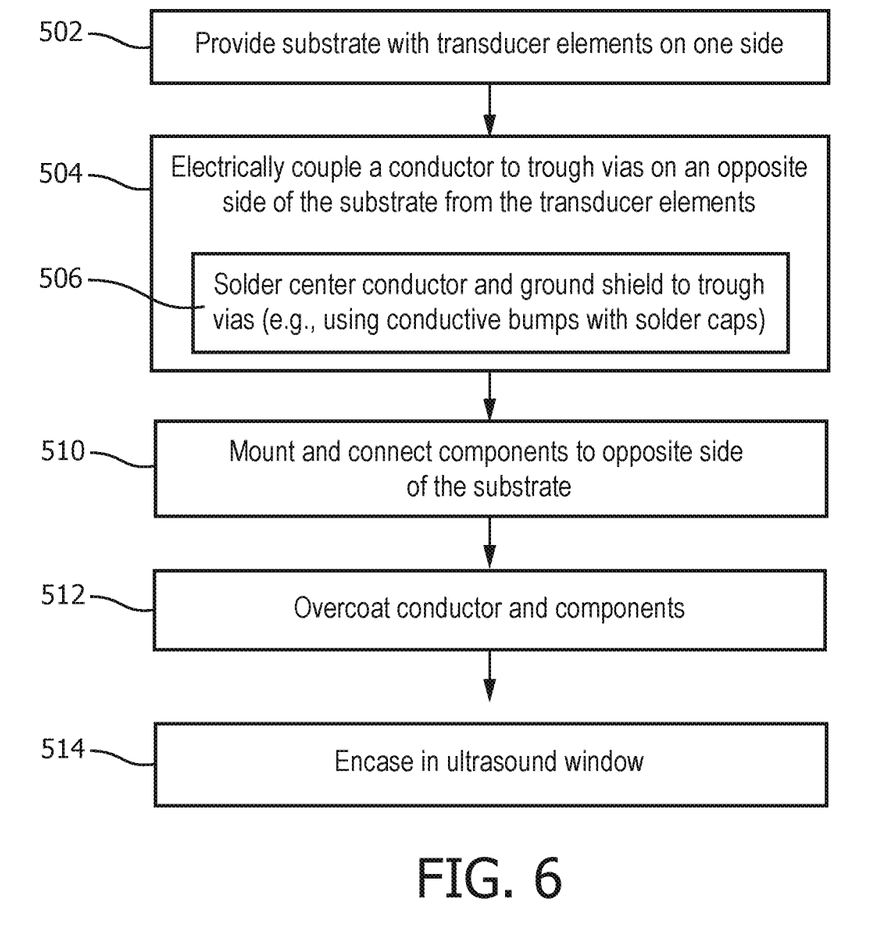
FIG. 6 is a flow diagram showing a method for fabricating an ultrasound device in accordance with illustrative embodiments.

Referring to FIG. 6, a method for fabricating an ultrasound device is illustratively shown. In block 502, a transducer array is provided on a first side of a substrate. The substrate includes at least one through via passing through a thickness of the substrate between the first side and a second side opposite the first side. The substrate may include capacitive micromachined ultrasound transducer (CMUT) elements, an interposer substrate with a one dimensional array of transducer elements or an application specific integrated circuit with a matrix array of transducer elements. Other configurations are also contemplated.

In block 504, a conductor is electrically coupled to the at least one through via. The conductor provides signals to and from the transducer array. In block 506, a conductive bump may be connected to the at least one through via. The conductive bump may include a solder cap for soldering to the conductor. The conductor may include a center conductor and a ground shield of a coaxial cable. The center conductor and the ground shield may be soldered to different through vias. Other connection technologies and methods may also be employed.

In block 510, a decoupling capacitor, thermistor or other component may be mounted on the second side of the substrate. In block 512, an overcoating material is provided on the conductor and any components mounted on the second side of the substrate. In block 514, the transducer array and conductor are encased in an ultrasound window, e.g., to form a transducer probe. The transducer probe is dimensioned to easily be employed for use with catheters or other internal imaging probes for medical or other applications.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function; and e) no specific sequence of acts is intended to be required unless specifically indicated.

Having described preferred embodiments for compact ultrasound transducer with direct coax attachment (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the embodiments disclosed herein as outlined by the appended claims. Having thus described the details and particularity required by the patent laws, what is claimed and desired protected by Letters Patent is set forth in the appended claims.

The invention claimed is:

1. An ultrasound device, comprising:
a single substrate comprising a transducer array and microbeamforming circuitry configured to partially beamform signals from the transducer array, the transducer array being on a first side of the single substrate;
a first through via passing through a thickness of the single substrate between the first side and a second side, opposite the first side;
a first conductive bump disposed on the second side of the single substrate and electrically coupled to the first through via;
a second through via passing through the thickness of the single substrate between the first side and the second side;
a second conductive bump disposed on the second side of the single substrate and electrically coupled to the second through via; and
a coaxial cable comprising:
a conductor electrically coupled to the first conductive bump on the second side of the single substrate to provide signals to and from the transducer array; and
a shield disposed around the conductor, wherein the shield is electrically coupled to the second conductive bump on the second side of the single substrate to provide an electrical ground.

2. The device as recited in claim 1, wherein the transducer array includes capacitive micromachined ultrasound transducer (CMUT) elements.

3. The device as recited in claim 1, wherein the single substrate is an interposer substrate and the transducer array is a one-dimensional array of transducer elements.

4. The device as recited in claim 1, wherein the single substrate is an application specific integrated circuit and the transducer array is a matrix array of transducer elements.

5. The device as recited in claim 4, wherein the single substrate includes a decoupling capacitor mounted on the second side of the single substrate.

6. The device as recited in claim 1,
wherein the coaxial cable comprises an end portion including the conductor and a central portion including the shield,
wherein the first through via is spaced from the second through via within the single substrate such that:
the first through via and first conductive bump are aligned with the end portion; and
the second through via and the second conductive bump are aligned with the central portion.

7. The device as recited in claim 1, wherein the first conductive bump includes a first solder cap directly contacting and soldering the conductor to the first conductive bump.

8. The device as recited in claim 1, wherein the single substrate is a silicon substrate and the at least one through via comprises a silicon via.

9. The device as recited in claim 1, further comprising an ultrasound window formed over the single substrate.

10. The device as recited in claim 7, wherein the second conductive bump includes a second solder cap directly contacting and soldering the shield to the second conductive bump.

11. The device as recited in claim 10, further comprising an overcoat covering the first and second conductive bumps, a portion of the conductor soldered to first conductive bump, and a portion of the shield soldered to the second conductive bump.

12. A method for fabricating an ultrasound device, comprising:
providing a single substrate comprising microbeamforming circuitry and a transducer array, the transducer array being on a first side of the single substrate, the single substrate including:
a first through via passing through a thickness of the single substrate between the first side and a second side, opposite the first side;
a first conductive bump disposed on the second side of the single substrate and electrically coupled to the first through via;
a second through via passing through the thickness of the single substrate between the first side and the second side;
a second conductive bump disposed on the second side of the single substrate and electrically coupled to the second through via;
electrically coupling a conductor of a coaxial cable to the first conductive bump on the second side of the single substrate, the conductor providing signals to and from the transducer array;
electrically coupling a shield of the coaxial cable to the second conductive bump on the second side of the single substrate such that the shield provides an electrical ground; and encasing the transducer array and conductor in an ultrasound window.

13. The method as recited in claim 12, wherein the single substrate includes capacitive micromachined ultrasound transducer (CMUT) elements, and
wherein the single substrate is at least one of:
an interposer substrate with a one-dimensional array of transducer elements, or
an application specific integrated circuit with a matrix array of transducer elements.

14. The method as recited in claim 12, wherein at least one of:
the transducer array includes capacitive micromachined ultrasound transducer (CMUT) elements,
the single substrate is an interposer substrate and the transducer array is a one-dimensional array of transducer elements, or
the single substrate is an application specific integrated circuit and the transducer array is a matrix array of transducer elements.

15. The method as recited in claim 12, further comprising mounting a decoupling capacitor on the second side of the single substrate.

16. The method as recited in claim 12, further comprising connecting the first conductive bump to the first through via, the first conductive bump including a first solder cap directly contacting and soldering the conductor to the first conductive bump.

17. The method as recited in claim 12, further comprising connecting the second conductive bump to the second through via, the second conductive bump including a second solder cap directly contacting and soldering the shield to the second conductive bump.

* * * * *